United States Patent
Yang et al.

(10) Patent No.: US 7,471,121 B2
(45) Date of Patent: Dec. 30, 2008

(54) TRANSISTOR DRIVE CIRCUIT OF POWER CONVERTER OPERATING IN A WIDE VOLTAGE RANGE

(75) Inventors: Ta-Yung Yang, Milpitas, CA (US); Feng-Cheng Tsao, Linbian Township, Pingtung County (TW); Chuh-Ching Li, Jhongli (TW); Jesse R. Wang, Singong Township, Hsinchu County (TW)

(73) Assignee: System General Corp., Taipei (TW)

( * ) Notice: Subject to any disclaimer, the term of this patent is extended or adjusted under 35 U.S.C. 154(b) by 24 days.

(21) Appl. No.: 11/614,928

(22) Filed: Dec. 21, 2006

(65) Prior Publication Data

US 2008/0150503 A1 Jun. 26, 2008

(51) Int. Cl.
*H03K 3/00* (2006.01)
(52) U.S. Cl. .......................... 327/108; 327/112; 326/87
(58) Field of Classification Search ................. 327/108, 327/112; 326/87
See application file for complete search history.

(56) References Cited

U.S. PATENT DOCUMENTS

| 4,991,140 | A | * | 2/1991 | Wang et al. | ................. 365/203 |
| 5,124,585 | A | * | 6/1992 | Kim et al. | ..................... 326/87 |
| 5,717,342 | A | * | 2/1998 | Lotfi et al. | .................... 326/17 |
| 5,760,634 | A | * | 6/1998 | Fu | .............................. 327/391 |

\* cited by examiner

*Primary Examiner*—Kenneth B. Wells

(57) ABSTRACT

A transistor drive circuit of a power converter is developed for operating in a wide voltage range. It includes an N-type high-side transistor, a P-type high-side transistor and an N-type low-side transistor. A voltage clamp device is connected to the gate of the N-type high-side transistor to limit the maximum output voltage. A detection circuit is coupled to detect the supply voltage of the transistor drive circuit to generate a disable signal in response to the voltage level of the supply voltage. The disable signal is coupled to disable the P-type high-side transistor once the voltage level of the supply voltage is higher than a threshold voltage.

9 Claims, 4 Drawing Sheets

TRANSISTOR DRIVE CIRCUIT OF POWER CONVERTER OPERATING IN A WIDE VOLTAGE RANGE

BACKGROUND OF THE INVENTION

1. Field of Invention

The present invention relates to a transistor drive circuit, and more specifically relates to a transistor drive circuit of a power converter.

2. Description of Related Art

Power converters have been widely used to provide regulated power supplies for computers, home appliances, communication equipments, mobile phones, etc. FIG. 1 shows a power converter for a battery charger. The maximum output voltage and the maximum output current of the power converter are regulated. It includes a transformer 10 having a primary winding $N_P$, a secondary winding $N_S$ and an auxiliary winding $N_A$. One terminal of the primary winding $N_P$ is coupled to an input voltage $V_{IN}$. Another terminal of the primary winding $N_P$ is connected to a transistor 20. The transistor 20 is applied to switch the transformer 10 and regulate the output of the power converter. A switching control circuit 100 is coupled to the output of the power converter through an optical coupler 70 to generate a switching signal $V_G$ for switching the transistor 20. The output of the optical coupler 70 generates a feedback signal $V_{FB}$ connected to a FB terminal of the switching control circuit 100. A resistor 25 is connected from the transistor 20 to ground for detecting the switching current of the transformer 10 and generating a switching current signal. The resistor 25 is further coupled to a VI terminal of the switching control circuit 100. Through a rectifier 30 and capacitors 35, 37, a voltage $V_S$ of the secondary winding $N_S$ produces an output voltage $V_O$ at the output of the power converter. A transistor 60 is connected to control the optical coupler 70. The transistor 60 is further coupled to the output voltage $V_O$ via a zener diode 80 and resistors 51, 52 to develop a voltage feedback loop to control the output voltage $V_O$. Furthermore, a resistor 50 is connected to the output of the power converter to detect an output current $I_O$. A transistor 65 is connected to control the optical coupler 70. The transistor 65 is further coupled to the resistor 50 to develop a current feedback loop to control the output current $I_O$. The voltage feedback loop controls the maximum output voltage $V_O$ of the power converter under the value of $V_{O\_MAX}$. The current feedback loop regulates the maximum output current $I_O$ of the power converter under the value of $I_{O\_MAX}$. FIG. 2 shows the output characteristic of the power converter. The power converter is operated under the constant voltage (CV) mode when the voltage feedback loop dominates the feedback loop. The power converter is operated at the constant current (CC) mode once the current feedback loop is operated.

A resistor 40 is connected to input voltage $V_{IN}$ to charge a capacitor 45 for providing an initial power to the switching control circuit 100. The auxiliary winding $N_A$ is used to further supply a power source to the switching control circuit 100 once the switching of the transformer 10 is started. A voltage $V_A$ generated at the auxiliary winding $N_A$ is correlated to the voltage $V_S$ of the secondary winding $N_S$. Through a rectifier 41, the voltage $V_A$ will produce a supply voltage $V_{CC}$ correlated to the output voltage $V_O$ of the power converter.

The supply voltage $V_{CC}$ is generated at the capacitor 45 that is connedted to a VCC terminal of the switching control circuit 100 to supply power source to the switching control circuit 100. However, the variation of the output voltage $V_O$ is wide once the power converter is operated in CC mode, which will cause a significant change at the supply voltage $V_{CC}$. For example, a 1V~5V variation of the output voltage $V_O$ may cause a change of 6V~30V at the supply voltage $V_{CC}$.

FIG. 3 shows a circuit schematic of the switching control circuit 100. The feedback signal $V_{FB}$ is connected to a positive input of a comparator 130 via a level-shift circuit. A transistor 140, resistors 145, 146 develop the level-shift circuit. The negative input of the comparator 130 is coupled to the VI terminal to receive the switching current signal. The output of the comparator 130 is connected to a reset input of a flip-flop 120 to reset the switching signal $V_G$. An oscillation circuit 110 generates a periodic pulse signal PLS to initiate the switching signal $V_G$. The pulse signal PLS is connected to a clock input of the flip-flop 120 via an inverter 115. The output of the inverter 115 is further connected to an input of an AND gate 125 in order to limit the maximum duty cycle of the switching signal $V_G$. The output of the flip-flop 120 is connected to another input of the AND gate 125. The output of the AND gate 125 generates a control signal PWM connected to an input of a drive circuit 200. The drive circuit 200 is utilized to generate the switching signal $V_G$ at an OUT terminal of the switching circuit 100 to control the transistor 20.

FIG. 4 shows a circuit schematic of the drive circuit 200. It includes a P-type transistor 210 having a source terminal connected to the supply voltage $V_{CC}$. A drain terminal of the P-type transistor 210 is connected to the OUT terminal. An NAND gate 230 controls a gate terminal of the P-type transistor 210. The control signal PWM is connected to an input of the NAND gate 230. An N-type transistor 220 has a drain terminal connected to the OUT terminal. A source terminal of the N-type transistor 220 is connected to the ground. An AND gate 240 controls a gate terminal of the N-type transistor 220. The control signal PWM is connected to an input of the AND gate 240 via an inverter 245. A switching signal VG1 is therefore generated at the OUT terminal in response to the control signal PWM. The output of the NAND gate 230 is connected to another input of the AND gate 240. The output of the AND gate 240 is connected to another input of the NAND gate 230 through an inverter 235. The NAND gate 230 and the AND gate 240 protect the P-type transistor 210 and the N-type transistor 220 from cross-conduction. The disadvantage of this circuit is an unlimited output voltage of the switching signal $V_{G1}$. The voltage of the switching signal VG1 is almost equal to the supply voltage $V_{CC}$. The supply voltage $V_{CC}$ may be higher than 20V. However, the 20V is the maximum gate-to-source voltage of the transistor in general. The transistor 20 may be permanently damaged when the gate-to-source voltage of transistors 20 is higher than 20V.

FIG. 5 shows another circuit schematic of the drive circuit 200. An N-type transistor 250 has a drain terminal connected to the supply voltage $V_{CC}$. A source terminal of the N-type transistor 250 is connected to the OUT terminal. An AND gate 270 controls a gate terminal of the N-type transistor 250. The control signal PWM is connected to an input of the AND gate 270. An N-type transistor 260 has a drain terminal connected to the OUT terminal. A source terminal of the N-type transistor 260 is connected to the ground. An AND gate 280 controls a gate terminal of the N-type transistor 260. The control signal PWM is connected to an input of the AND gate 280 via an inverter 285. A switching signal $V_{G2}$ is therefore generated at the OUT terminal in response to the control signal PWM. The output of the AND gate 270 is connected to another input of the AND gate 280 through an inverter 286. The output of the AND gate 280 is connected to another input of the AND gate 270 through an inverter 275. The AND gate 270 and the AND gate 280 protect the N-type transistor 250 and the N-type transistor 260 from cross-conduction. A voltage clamp device 255, such as a zener diode, is coupled to the gate of the N-type transistor 250. The voltage clamp device 255 clamps the maximum output voltage of the switching signal VG2, which protects the transistor 20 from over-voltage damage. FIG. 6 shows the circuit of the AND gate 270. A current source 271 is connected to the output of the AND gate 270. The drain of transistors 272 and the drain of the transistor 273 are connected the output of the AND gate 270. The gate of transistors 272 and the gate of the transistor 273 are connected to inputs of the AND gate 270. The current source 271 limits the current flowed through the voltage clamp device 255 when the voltage clamp device 255 is enabled. The disadvantage of the circuit shown in FIG. 5 is a low output voltage of the switching signal VG2, particularly when the supply voltage $V_{CC}$ is low. The voltage of the switching single $V_{G2}$ is given by, $$V_{G2} = V_{CC} - V_{GS250} \qquad (3)$$

where the $V_{G2}$ is the voltage of a logic-high switching signal $V_{G2}$; $V_{GS250}$ is the gate-to-source threshold voltage of the transistor 250, and is around 2V normally.

Since the supply voltage $V_{CC}$ may be lower than 6V, which may produce a switching signal $V_{G2}$ lower than 4V. However, a minimum gate-to-source voltage is around 4V that is required to turn on a high-voltage transistor such as the transistor 20. Furthermore, a low gate-to-source voltage will cause a high $R_{DS-ON}$ (drain-to-source ON resistance) of the transistor, which will increase the power losses of the power converter.

Both output drive circuits shown in FIG. 4 and FIG. 5 are inadequate to be used in a wide range of the supply voltage $V_{CC}$. The main object of the present invention is to overcome the above-mentioned shortcomings.

SUMMARY OF THE INVENTION

An object of the present invention is to develop a transistor drive circuit of a power converter for operating in a wide voltage range. It includes an N-type high-side transistor, a P-type high-side transistor and an N-type low-side transistor. A voltage clamp device is connected to the gate of the N-type high-side transistor to limit the maximum output voltage of the N-type high-side transistor. The voltage level of the output signal through the P-type high-side transistor is the same as the supply voltage of the transistor drive circuit. However, a detection circuit is coupled to detect the supply voltage of the transistor drive circuit for generating a disable signal in response to the voltage level of the supply voltage. The disable signal is coupled to disable the P-type high-side transistor once the voltage level of the supply voltage is higher than a threshold voltage.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
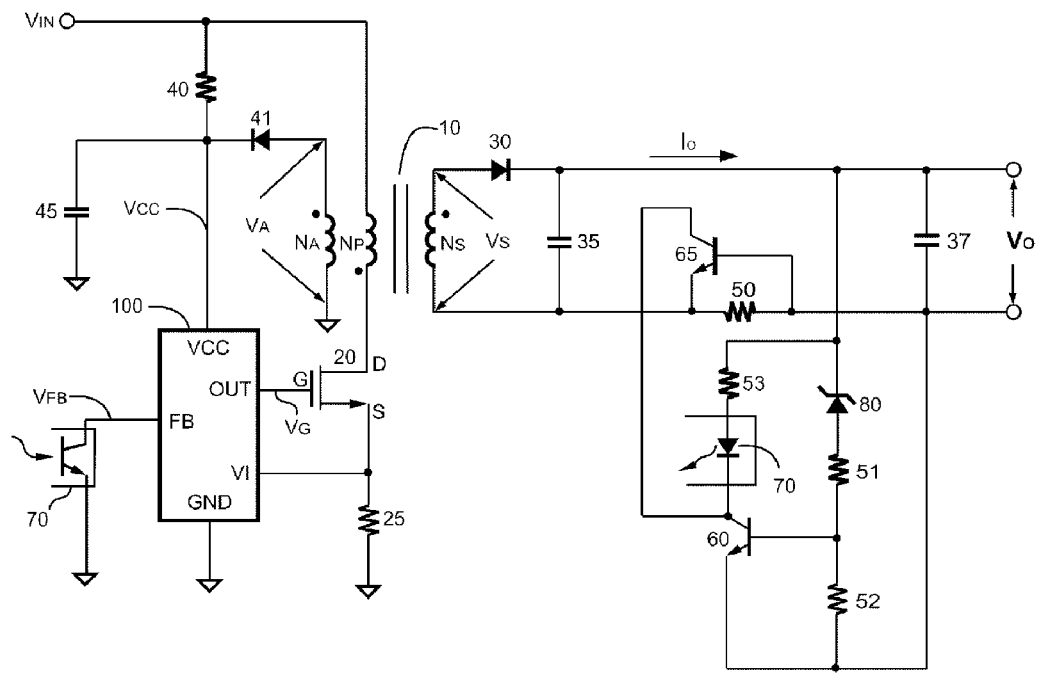
FIG. 1 shows a power converter for a battery charger.
Figure 2:
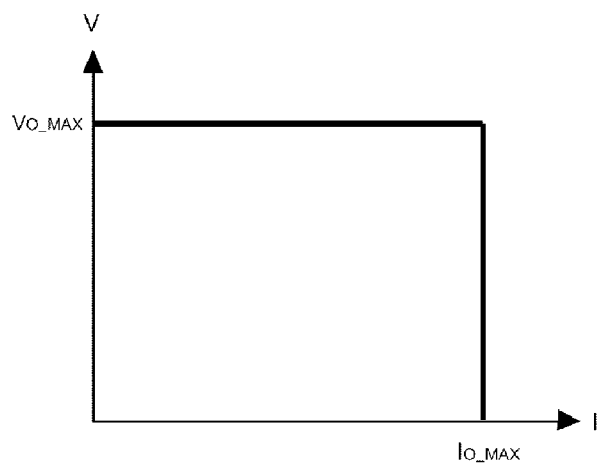
FIG. 2 shows the output characteristic of the power converter shown in FIG. 1.
Figure 3:
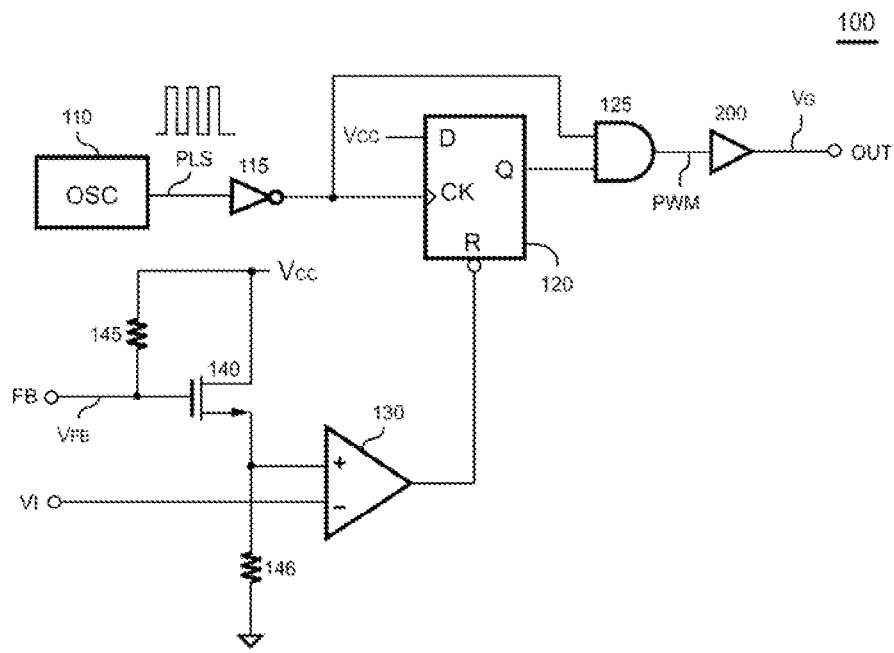
FIG. 3 shows the circuit schematic of a switching control circuit.
Figure 4:
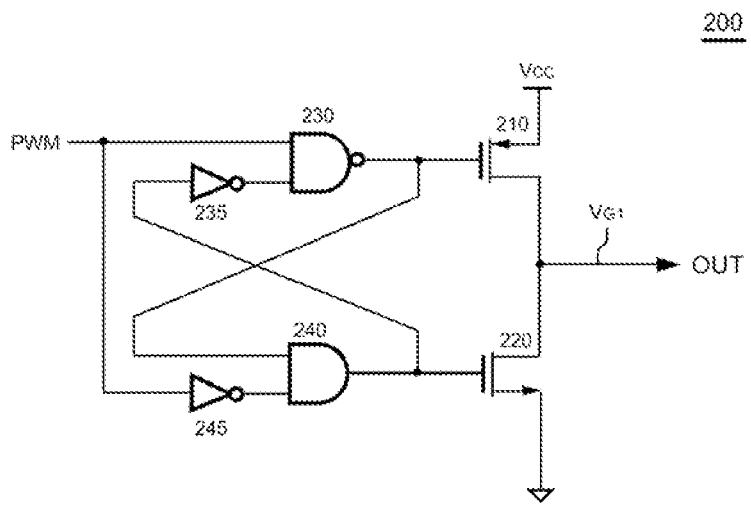
FIG. 4 shows a circuit schematic of a transistor drive circuit in a prior art.
Figure 5:
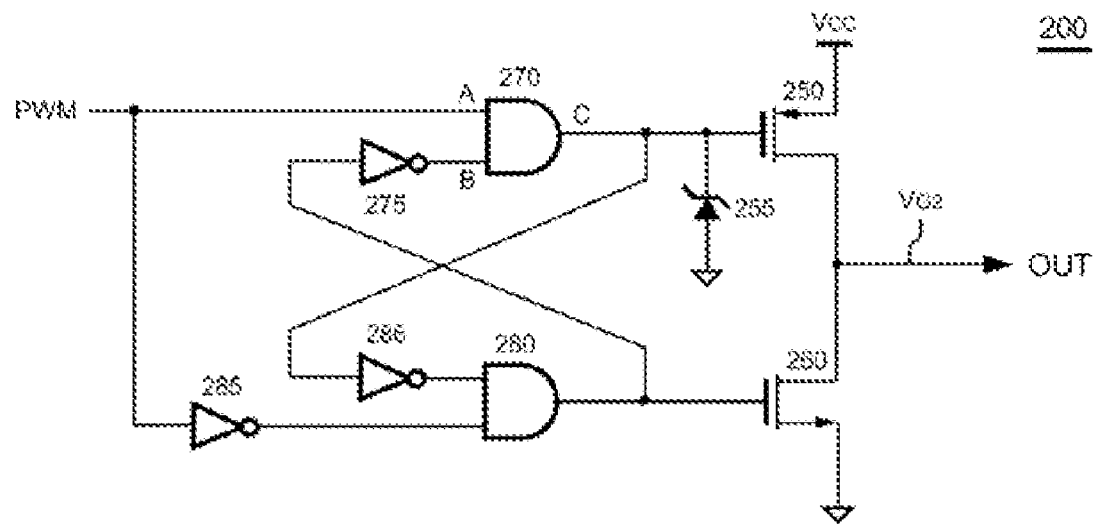
FIG. 5 shows another circuit schematic of a transistor drive circuit.
Figure 6:
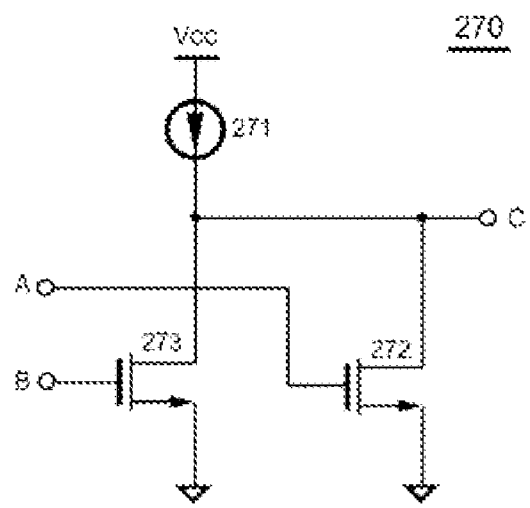
FIG. 6 shows a preferred AND gate for a transistor drive circuit.

Reference will now be made in detail to the present preferred embodiments of the invention, examples of which are illustrated in the accompanying drawings. Wherever possible, the same reference numbers are used in the drawings and the description to refer to the same or like parts.

Figure 7:
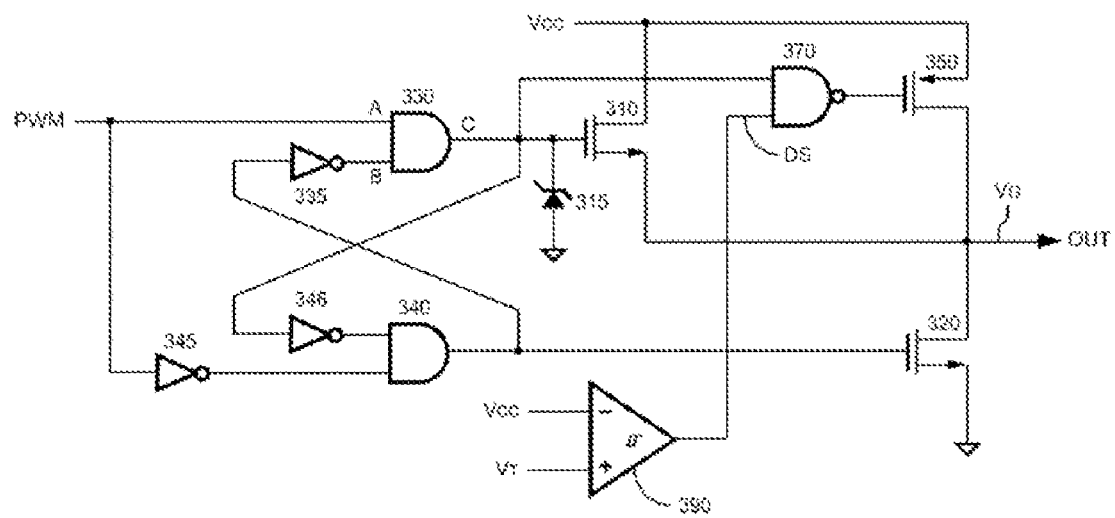
FIG. 7 shows a preferred embodiment of a transistor drive circuit according to the present invention.

FIG. 7 shows a preferred transistor drive circuit according to the present invention. It includes an input terminal VCC to receive the supply voltage $V_{CC}$. Several logic devices, such as AND gates 330 and 340, inverters 335, 345 and 346, an NAND gate 370, and an comparator 390, develop a control circuit. The output terminal OUT is coupled to output the switching signal $V_G$ for driving the transistor 20 of the power converter. A type-I transistor, which is the N-type high-side transistor 310 in the embodiment, having a drain terminal is coupled to the input terminal VCC. A source terminal of the N-type high-side transistor 310 is coupled to the output terminal OUT. A type-II transistor, which is the P-type high-side transistor 350 in the embodiment, having a source terminal is coupled to the input terminal VCC. A drain terminal of the P-type high-side transistor 350 is coupled to the output terminal OUT. Another type-I transistor, which is the N-type low-side transistor 320 in the embodiment, having a drain terminal is connected to the output terminal OUT. A source terminal of the N-type low-side transistor 320 is coupled to the ground.

The AND gate 330, the inverter 335 and the NAND gate 370 develop a first control circuit. The output of the AND gate 330 is connected to the gate terminal of the N-type high-side transistor 310 for controlling the N-type high-side transistor 310 in accordance with the control signal PWM and an output of the inverter 335. The output of the NAND gate 370 is connected to the gate terminal of the P-type high-side transistor 350 for controlling the P-type high-side transistor 350 in accordance with the disable signal DS and the output of the AND gate 330. The inverter 335 inverts a signal used for controlling the N-type low-side transistor 320.

The AND gate 340 and inverters 345, 346 form a second control circuit. The control signal PWM is connected to one input of the AND gate 340 through the inverter 345. Furthermore, the gate terminal of the N-type high-side transistor 310 is connected to another input of the AND gate 340 through the inverter 346. The output of the AND gate 340 is coupled to the gate terminal of the N-type low-side transistor 320 for controlling the N-type low-side transistor 320 in accordance with the two inputs of the AND gate 340. The comparator 390 and a threshold voltage $V_T$ develop a detection circuit. The negative input of the comparator 390 is connected to the threshold voltage $V_T$. The positive input of the comparator 390 is coupled to detect the supply voltage $V_{CC}$. The output of the comparator 390 will generate a disable signal DS when the voltage level of the supply voltage $V_{CC}$ is higher than the threshold voltage $V_T$. The comparator 390 includes a hysteresis. The disable signal DS is connected to another input of the NAND gate 370 to disable the P-type high-side transistor 350 once the voltage level of the supply voltage $V_{CC}$ is higher than the threshold voltage $V_T$.

Furthermore, a voltage clamp device 315 is coupled to the gate terminal the N-type high-side transistor 310 to clamp the maximum output voltage of the switching signal VG. The output of the AND gate 340 is connected to the input of the AND gate 330 via the inverter 335. The output of the AND gate 330 is connected to the input of the AND gate 340 through the inverter 346. Therefore the first control circuit and the second control circuit are connected to form an exclusive logic to protect the N-type high-side transistor 310 and the N-type low-side transistor 320 from cross-conduction. Besides, the exclusive logic of the first control circuit and the second control circuit also protects the P-type high-side transistor 350 and the N-type low-side transistor 320 from cross-conduction.

When the supply voltage $V_{CC}$ is low, the P-type high-side transistor 350 provides a channel to output a voltage that is the same as the supply voltage $V_{CC}$. When the supply voltage $V_{CC}$ is high, the voltage clamp device 315 clamps the maximum output voltage of the N-type high-side transistor 310. Besides, the P-type high-side transistor 350 is disabled to limits the maximum output voltage of the switching signal $V_G$. Therefore, the transistor drive circuit of the present invention can be operated at a wide range of the supply voltage $V_{CC}$.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A transistor drive circuit of a power converter, comprising:
    an input terminal to receive a supply voltage;
    an output terminal to output a switching signal for driving a transistor of the power converter;
    an N-type high-side transistor having a drain terminal coupled to the input terminal, a source terminal of the N-type high-side transistor coupled to the output terminal;
    a P-type high-side transistor having a source terminal coupled to the input terminal, a drain terminal of the P-type high-side transistor coupled to the output terminal;
    an N-type low-side transistor having a drain terminal coupled to the output terminal, a source terminal of the N-type low-side transistor coupled to a ground;
    a first control circuit coupled to control the gate terminal of the N-type high-side transistor and the gate terminal of the P-type high-side transistor;
    a second control circuit coupled to control the gate terminal of the N-type low-side transistor; and
    a detection circuit coupled to the supply voltage to generate a disable signal in response to the voltage level of the supply voltage,
    wherein the disable signal is transmitted to the first control circuit to disable the P-type high-side transistor once the voltage level of the supply voltage is higher than a threshold voltage.

2. The transistor drive circuit as claimed in claim 1, further comprising a voltage clamp device coupled to the gate terminal of the N-type high-side transistor to clamp the maximum output voltage of the switching signal.

3. The transistor drive circuit as claimed in claim 1, wherein the first control circuit and the second control circuit are coupled to receive a control signal for generating the switching signal; the first control circuit and the second control circuit are used to protect the N-type high-side transistor and the N-type low-side transistor from cross-conduction.

4. The transistor drive circuit as claimed in claim 1, wherein the first control circuit and the second control circuit are further used to protect the P-type high-side transistor and the N-type low-side transistor from cross-conduction.

5. A transistor drive circuit for driving a switching transistor of a power converter, comprising:
    an input terminal to receive a supply voltage;
    an output terminal to output a switching signal for driving the switching transistor;
    a first type-I transistor coupled between the input terminal and the output terminal;
    a first type-II transistor coupled between the input terminal and the output terminal;
    a second type-I transistor coupled between the output terminal and a ground; and
    a control circuit to control the type-I and type-II transistors in response to a control signal, the control circuit comprising:
    a first control circuit coupled to control the first type-I end type-II transistors, and
    a second control circuit coupled to control the second type-I transistor, the first control circuit and the second control circuit being configured for protecting the first type-I transistor and the second type-I transistor from cross-conduction and for protecting the first type-II transistor and the second type-I transistor from cross-conduction; and
    a detection circuit coupled to the supply voltage to generate a disable signal in response to the voltage level of the supply voltage, the disable signal being transmitted to the first control circuit to disable the first type-II transistor once the voltage level of the supply voltage is higher than a threshold voltage.

6. The transistor drive circuit as claimed in claim 5, wherein the first and second type-I transistors are N-type transistors, and the first type-II transistor is a P-type transistor.

7. The transistor drive circuit as claimed in claim 5, wherein the first control circuit comprises:
    an inverter to invert a signal used for controlling the second type-I transistor;
    an AND gate for receiving the control signal and an output of the inverter and outputting a signal to control the first type-I transistor; and
    an NAND gate for outputting a signal to control the first type-II transistor in accordance with the disable signal and an output of the AND gate.

8. The transistor drive circuit as claimed in claim 5, wherein the second control circuit comprises:
    a first inverter to invert a signal used for controlling the first type-I transistor to generate a first signal; and
    an AND gate for outputting a signal to control the second type-I transistor in accordance with the control signal and the first signal.

9. The transistor drive circuit as claimed in claim 5, further comprising a voltage clamp device coupled to the gate terminal of the first type-I transistor to clamp the maximum output voltage of the switching signal.

* * * * *